(12) United States Patent
Tao et al.

(10) Patent No.: US 11,923,373 B2
(45) Date of Patent: Mar. 5, 2024

(54) SEMICONDUCTOR STRUCTURE

(71) Applicant: UNITED MICROELECTRONICS CORP., Hsin-Chu (TW)

(72) Inventors: Bo Tao, Singapore (SG); Li Wang, Singapore (SG); Ching-Yang Wen, Pingtung County (TW); Purakh Raj Verma, Singapore (SG); Zhibiao Zhou, Singapore (SG); Dong Yin, Nantong (CN); Gang Ren, Singapore (SG); Jian Xie, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 196 days.

(21) Appl. No.: 17/502,026

(22) Filed: Oct. 14, 2021

(65) Prior Publication Data

US 2023/0082878 A1 Mar. 16, 2023

(30) Foreign Application Priority Data

Sep. 14, 2021 (CN) .......................... 202111073572.9

(51) Int. Cl.
| | |
|---|---|
| *H01L 27/12* | (2006.01) |
| *G11C 17/16* | (2006.01) |
| *H01L 23/525* | (2006.01) |
| *H10B 20/20* | (2023.01) |
| *H10B 20/25* | (2023.01) |

(52) U.S. Cl.
CPC .......... *H01L 27/1207* (2013.01); *G11C 17/16* (2013.01); *G11C 17/165* (2013.01); *H01L 23/5252* (2013.01); *H10B 20/20* (2023.02); *H10B 20/25* (2023.02)

(58) Field of Classification Search
CPC ............ H01L 27/1207; H01L 23/5252; G11C 17/165; G11C 17/16; H10B 20/20
See application file for complete search history.

(56) References Cited

U.S. PATENT DOCUMENTS

| | | | |
|---|---|---|---|
| 5,641,985 A * | 6/1997 | Tamura ............... | H01L 23/5252 257/50 |
| 6,716,678 B2 * | 4/2004 | Lehr .................... | H01L 23/5252 438/131 |
| 6,902,958 B2 | 6/2005 | Ito | |

(Continued)

*Primary Examiner* — Ahmed N Sefer
(74) *Attorney, Agent, or Firm* — Winston Hsu

(57) ABSTRACT

A semiconductor structure includes a semiconductor on insulator (SOI) substrate, a first electrically conductive structure, and a second electrically conductive structure. The SOI substrate includes a base substrate, a buried insulation layer disposed on the base substrate, a semiconductor layer disposed on the buried insulation layer, and a trap rich layer disposed between the buried insulation layer and the base substrate. At least a part of the first electrically conductive structure and at least a part of the second electrically conductive structure are disposed in the trap rich layer. A part of the trap rich layer is disposed between the first electrically conductive structure and the second electrically conductive structure. The first electrically conductive structure, the second electrically conductive structure, and the trap rich layer disposed between the first electrically conductive structure and the second electrically conductive structure are at least a portion of an anti-fuse structure.

18 Claims, 5 Drawing Sheets

(56) References Cited

U.S. PATENT DOCUMENTS

| | | | |
|---|---|---|---|
| 7,911,012 B2 | 3/2011 | Leedy | |
| 8,299,570 B2 | 10/2012 | Kim | |
| 8,552,548 B1* | 10/2013 | Do | H01L 21/76879 |
| | | | 257/E21.597 |
| 8,679,917 B2 | 3/2014 | Lung | |
| 8,884,398 B2 | 11/2014 | Lin | |
| 8,913,449 B2 | 12/2014 | Chung | |
| 9,129,687 B2 | 9/2015 | Kurjanowicz | |
| 9,356,030 B2 | 5/2016 | Tajima | |
| 9,431,340 B2 | 8/2016 | Kirihata | |
| 2008/0143379 A1* | 6/2008 | Norman | H05K 1/029 |
| | | | 257/E23.079 |
| 2008/0157267 A1* | 7/2008 | Gerber | H05K 1/141 |
| | | | 257/528 |
| 2010/0128511 A1* | 5/2010 | Worley | G11C 17/16 |
| | | | 365/96 |
| 2011/0254121 A1* | 10/2011 | Cheng | H01L 23/5252 |
| | | | 438/467 |
| 2012/0104545 A1* | 5/2012 | Takeshima | H01L 27/0248 |
| | | | 257/530 |
| 2015/0235945 A1* | 8/2015 | Kirihata | H01L 23/5256 |
| | | | 257/529 |
| 2017/0162503 A1* | 6/2017 | Olac-Vaw | H01L 29/42376 |
| 2021/0118797 A1* | 4/2021 | Hao | H01L 23/5252 |
| 2022/0328507 A1* | 10/2022 | Chang | H01L 23/5252 |
| 2022/0344261 A1* | 10/2022 | Huang | H01L 23/53238 |

* cited by examiner

SEMICONDUCTOR STRUCTURE

BACKGROUND OF THE INVENTION

1. Field of the Invention

The present invention relates to a semiconductor structure, and more particularly, to a semiconductor structure including an anti-fuse structure.

2. Description of the Prior Art

The anti-fuse is an element whose two ends are short-circuited after being blown and that is opposite to the fuse. When the anti-fuse is in the open state, there is a high resistance between two ends of the anti-fuse. By applying high voltage to the two ends of the anti-fuse, the insulating layer located between the two ends of the anti-fuse can be penetrated to form a short circuit (i.e. reducing the resistance). Therefore, the anti-fuse may be suitable for application in the programming memory, and the programmable memory using the anti-fuse has the characteristics of one-time programming (OTP), which may provide better protection in terms of confidentiality.

SUMMARY OF THE INVENTION

A semiconductor structure is provided in the present invention. A trap rich layer in a semiconductor on insulator (SOI) substrate and electrically conductive structures are used to constitute an anti-fuse structure. The process of forming the anti-fuse structure may be integrated with processes of forming other semiconductor devices on the SOI substrate accordingly.

According to an embodiment of the present invention, a semiconductor structure is provided. The semiconductor structure includes a semiconductor on insulator (SOI) substrate, a first electrically conductive structure, and a second electrically conductive structure. The semiconductor on insulator substrate includes a base substrate, a buried insulation layer, a semiconductor layer, and a trap rich layer. The buried insulation layer is disposed on the base substrate. The semiconductor layer is disposed on the buried insulation layer. The trap rich layer is disposed between the buried insulation layer and the base substrate. At least a part of the first electrically conductive structure is disposed in the trap rich layer, at least a part of the second electrically conductive structure is disposed in the trap rich layer, and a part of the trap rich layer is disposed between the first electrically conductive structure and the second electrically conductive structure. The first electrically conductive structure, the second electrically conductive structure, and the trap rich layer disposed between the first electrically conductive structure and the second electrically conductive structure are at least a portion of an anti-fuse structure.

These and other objectives of the present invention will no doubt become obvious to those of ordinary skill in the art after reading the following detailed description of the preferred embodiment that is illustrated in the various figures and drawings.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The ordinal numbers, such as "first", "second", etc., used in the description and the claims are used to modify the elements in the claims and do not themselves imply and represent that the claim has any previous ordinal number, do not represent the sequence of some claimed element and another claimed element, and do not represent the sequence of the manufacturing methods, unless an addition description is accompanied. The use of these ordinal numbers is only used to make a claimed element with a certain name clear from another claimed element with the same name.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
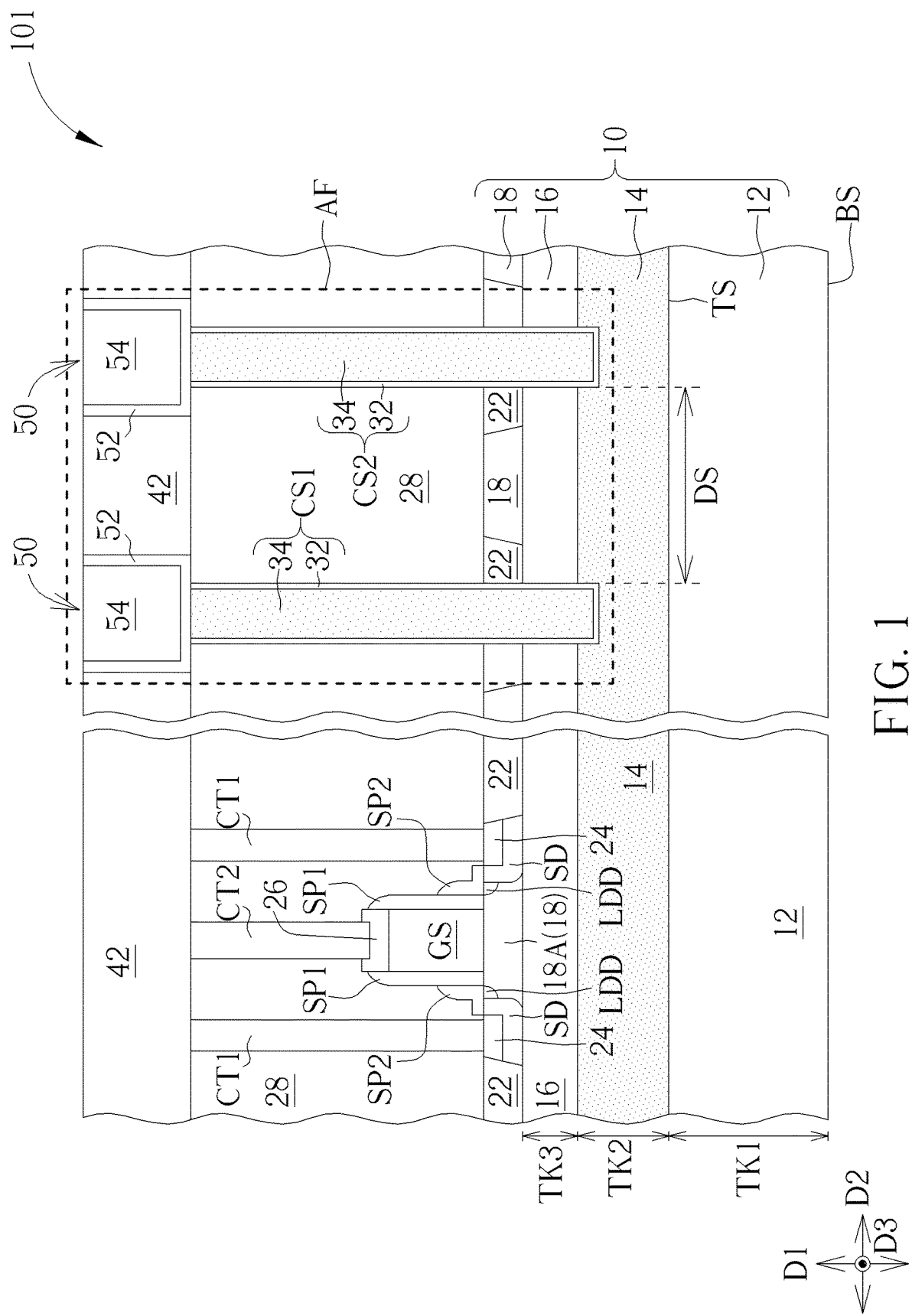
FIG. 1 is a schematic drawing illustrating a semiconductor structure according to a first embodiment of the present invention.

Please refer to FIG. 1. FIG. 1 is a schematic drawing illustrating a semiconductor structure 101 according to a first embodiment of the present invention. As shown in FIG. 1, the semiconductor structure 101 includes a semiconductor on insulator (SOI) substrate 10, a first electrically conductive structure CS1, and a second electrically conductive structure CS2. The semiconductor on insulator substrate 10 includes a base substrate 12, a buried insulation layer 16, a semiconductor layer 18, and a trap rich layer 14. The buried insulation layer 16 is disposed on the base substrate 12. The semiconductor layer 18 is disposed on the buried insulation layer 16. The trap rich layer 14 is disposed between the base substrate 12 and the buried insulation layer 16. At least a part of the first electrically conductive structure CS1 is disposed in the trap rich layer 14, and at least a part of the second electrically conductive structure CS2 is disposed in the trap rich layer 14. A part of the trap rich layer 14 is disposed between the first electrically conductive structure CS1 and the second electrically conductive structure CS2. The first electrically conductive structure CS1, the second electrically conductive structure CS2, and the trap rich layer 14 disposed between the first electrically conductive structure CS1 and the second electrically conductive structure CS2 are at least a portion of an anti-fuse structure AF.

In some embodiments, the semiconductor on insulator substrate 10 including the trap rich layer 14 may be applied for forming radiofrequency (RF) devices, and the trap rich layer 14 may capture free electrons in the device under high frequency operation for improving the operation performance of the radiofrequency device. In other words, a material composition of the trap rich layer 14 is different from a material composition of the base substrate 12 in the semiconductor on insulator substrate 10 and a material composition of the buried insulation layer 16 in the semiconductor on insulator substrate 10, and the ability of the trap rich layer 14 to capture free electrons is better than that of the base substrate 12 and that of the buried insulation layer 16 in the semiconductor on insulator substrate 10. In the present invention, two electrically conductive terminals (such as the first electrically conductive structure CS1 and the second electrically conductive structure CS2) may be disposed in the trap rich layer 14 for forming the anti-fuse structure AF including a portion of the trap rich layer 14. The process of forming the anti-fuse structure AF may be integrated with processes of forming other semiconductor devices on the semiconductor on insulator substrate 10 accordingly, and the purposes of process integration and/or process simplification may be achieved.

In some embodiments, the trap rich layer 14 may be a high electrical resistance material. For example, the electrical resistance of the trap rich layer 14 may be higher than or equal to $10^8$ ohms, but not limited thereto. By applying suitable voltage to the first electrically conductive structure CS1 and the second electrically conductive structure CS2, the electrons trapped and/or captured in the portion of the trap rich layer 14 located between the first electrically conductive structure CS1 and the second electrically conductive structure CS2 may increase, and the electrical resistance of the portion of the trap rich layer 14 may be reduced accordingly for realizing operation of an anti-fuse structure. In some embodiments, the anti-fuse structure AF may have the characteristics of one-time programming (OTP) and may be applied in a memory structure accordingly, but not limited thereto. For example, the high resistance state of the anti-fuse structure AF before being programmed may be read and regarded as signal 0, and the low resistance state of the anti-fuse structure AF after being programmed may be read and regarded as signal 1, but not limited thereto. In some embodiments, the trap rich layer 14 may include polysilicon, silicon oxide (such as $SiO_x$, wherein x ranges from 0.1 to 2), silicon nitride (such as $SiN_y$, wherein y ranges from 0.1 to 2), silicon oxynitride (such as $SiO_xN_y$, wherein x ranges from 0.1 to 2 and y ranges from 0.1 to 2), or other materials with better ability to capture free electrons and different from that of the base substrate 12 and that of the buried insulation layer 16. For example, the trap rich layer 14 may be an undoped polysilicon layer, and the ability of the polysilicon layer to capture free electrons is better than that of the base substrate 12 (such as a silicon substrate) and that of the buried insulation layer 16 (such as an oxide insulation layer). In addition, the anti-fuse structure AF with required characteristics may be obtained by selecting the material of the trap rich layer 14, controlling the depth of the first electrically conductive structure CS1 and the depth of the second electrically conductive structure CS2 in the trap rich layer 14, and/or controlling the distance between the first electrically conductive structure CS1 and the second electrically conductive structure CS2 in the trap rich layer 14.

In some embodiments, a distance DS between the first electrically conductive structure CS1 and the second electrically conductive structure CS2 in a horizontal direction (such as a second direction D2 shown in FIG. 1) may be greater than or equal to 0.2 micrometers and less than or equal to 5 micrometers for keeping enough trap rich layer 14 located between the first electrically conductive structure CS1 and the second electrically conductive structure CS2 for the anti-fuse operation described above and avoiding excessive distance between the first electrically conductive structure CS1 and the second electrically conductive structure CS2 which may cause operation problems (for example, excessive voltage will be required to achieve the desired effect). For example, when the trap rich layer 14 is an undoped polysilicon layer and the distance between the first electrically conductive structure CS1 and the second electrically conductive structure CS2 is controlled, the electrical resistance of the anti-fuse structure AF may be reduced significantly (for example, a resistance difference of about 5 orders of magnitude may be obtained) by applying a voltage difference of about 20 volts to 60 volts between the first electrically conductive structure CS1 and the second electrically conductive structure CS2, and the programming effect may be realized accordingly. Additionally, the electrical resistance of the anti-fuse structure AF after programming may be linearly correlated with the test voltage without related problems such as grow back, and the anti-fuse structure AF may be regarded as having the characteristics of one-time programming (OTP) accordingly.

In some embodiments, a vertical direction (such as a first direction D1 shown in FIG. 1) may be regarded as a thickness direction of the base substrate 12. The base substrate 12 may have a top surface TS and a bottom surface BS opposite to the top surface TS in the first direction D1, and the trap rich layer 14, the buried insulation layer 16, the semiconductor layer 18, and the anti-fuse structure AF described above may be disposed at a side of the top surface TS. A horizontal direction substantially orthogonal to the first direction D1 (such as the second direction D2 and/or a third direction D3 shown in FIG. 1) may be substantially parallel with the top surface TS and/or the bottom surface BS of the base substrate 12, but not limited thereto. Additionally, in this description, a distance between the bottom surface BS of the base substrate 12 and a relatively higher location and/or a relatively higher part in the vertical direction (such as the first direction D1) may be greater than a distance between the bottom surface BS of the base substrate 12 and a relatively lower location and/or a relatively lower part in the first direction D1. The bottom or a lower portion of each component may be closer to the bottom surface BS of the base substrate 12 in the first direction D1 than the top or upper portion of this component. Another component disposed above a specific component may be regarded as being relatively far from the bottom surface BS of the base substrate 12 in the first direction D1, and another component disposed under a specific component may be regarded as being relatively closer to the bottom surface BS of the base substrate 12 in the first direction D1, but not limited thereto.

In some embodiments, the first electrically conductive structure CS1 and the second electrically conductive structure CS2 may penetrate through the semiconductor layer 18 and the buried insulation layer 16 of the semiconductor on insulator substrate 10 in the first direction D1 for being partially disposed in the trap rich layer 14 and directly contacting the trap rich layer 14. In other words, in some embodiments, the distance DS between the first electrically conductive structure CS1 and the second electrically conductive structure CS2 in the second direction D2 may be equal to a length of the trap rich layer 14 disposed between the first electrically conductive structure CS1 and the second electrically conductive structure CS2 in the second direction D2. In some embodiments, the trap rich layer 14 may be directly connected with the base substrate 12 and the buried insulation layer 16, the base substrate 12 may include a silicon substrate or a substrate made of other suitable materials, and the electrical resistivity of the trap rich layer 14 may be higher than the electrical resistivity of the base substrate 12, but not limited thereto. The buried insulation layer 16 may include an oxide insulation layer, such as a buried oxide (BOX) layer, or other suitable insulation materials, and the semiconductor layer 19 may include a silicon-containing semiconductor layer (such as a single crystal silicon semiconductor layer) or other kinds of semiconductor materials. Additionally, the base substrate 12 may be used as a high electrical resistance substrate in the manufacturing procedures and has to be relatively thicker, and the trap rich layer 14 needs to have a certain thickness for capturing free electrons. Therefore, a thickness TK2 of the trap rich layer 14 may be less than a thickness TK1 of the base substrate 12, and the thickness TK2 of the trap rich layer 14 may be greater than a thickness TK3 of the buried insulation layer 16, but not limited thereto.

In some embodiments, the semiconductor structure 101 may further include an isolation structure 22, a gate structure GS, a plurality of source/drain doped regions SD, a plurality of lightly doped regions LDD, and a dielectric layer 28. The isolation structure 22 may be disposed in the semiconductor layer 18 for defining a body region 18A of a transistor structure TR in the semiconductor layer 18, and the isolation structure 22 may include a single layer or multiple layers of insulation materials, such as an oxide insulation material and an oxynitride insulation materials, but not limited thereto. In some embodiments, a portion of the semiconductor layer 18 may be the body region 18A of the transistor structure TR, the gate structure GS may be disposed on the body region 18A, and the source/drain doped regions SD and the lightly doped regions LDD may be disposed in the semiconductor layer 18 and disposed adjacent to the body region 18A. The gate structure GS, the lightly doped regions LDD, the source/drain doped regions SD, and the body region 18A may constitute the transistor structure TR, and the dielectric layer 28 may be disposed on the semiconductor on insulator substrate 10 and cover the transistor structure TR. In some embodiments, the source/drain doped regions SD and the lightly doped regions LDD may be a doped region doped with n type impurities or p type impurities, respectively. The gate structure GS may include a gate insulation layer (not illustrated) and a gate electrode (not illustrated) disposed on the gate insulation layer. The gate insulation layer may include an oxide layer, such as a silicon oxide layer, or other suitable dielectric materials, and the gate electrode may include a non-metallic gate electrode, such as a polysilicon gate electrode, or a gate electrode made of other suitable electrically conductive materials. In addition, the dielectric layer 28 may include multiple layers of dielectric materials, such as silicon oxide, silicon nitride, silicon oxynitride, a low dielectric constant (low-k) material, or other suitable dielectric materials.

In some embodiments, the first electrically conductive structure CS1 and the second electrically conductive structure CS2 may penetrate through the isolation structure 22 and the dielectric layer 28 in the first direction D1. The first electrically conductive structure CS1 and the second electrically conductive structure CS2 may be physically and electrically separated from the semiconductor layer 18 by the isolation structure 22, and the anti-fuse structure AF may be electrically separated from the transistor structure TR accordingly. In some embodiments, the transistor structure TR may be a radiofrequency switch device, and the trap rich layer 14 may capture free electrons under high frequency operation of the radiofrequency switch device, but not limited thereto. Additionally, in some embodiments, the anti-fuse structure AF and the transistor structure TR may be disposed on different areas of the semiconductor on insulator substrate 10, respectively, and may be electrically separated from each other, and there is not any active device (such as transistor) disposed between the first electrically conductive structure CS1 and the second electrically conductive structure CS2 of the anti-fuse structure AF for avoiding operation interference therebetween, but not limited thereto.

Figure 2:
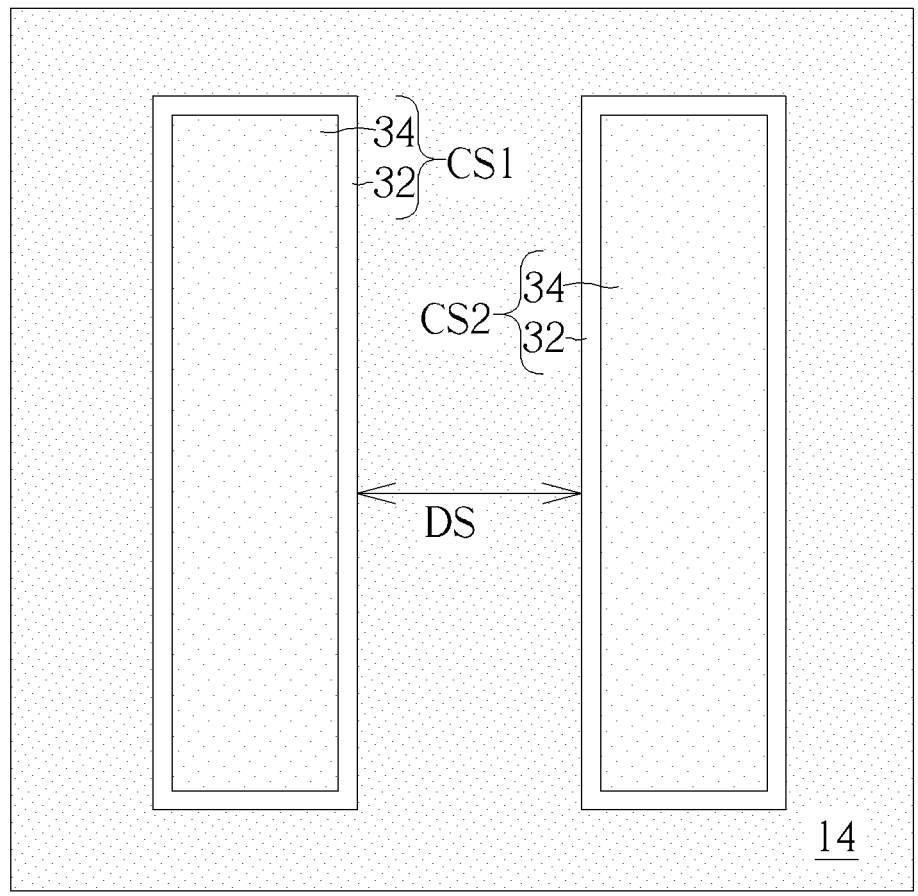
FIG. 2 is a schematic drawing illustrating a top view of an anti-fuse structure according to an embodiment of the present invention.
Figure 2:
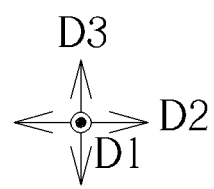
Figure 3:
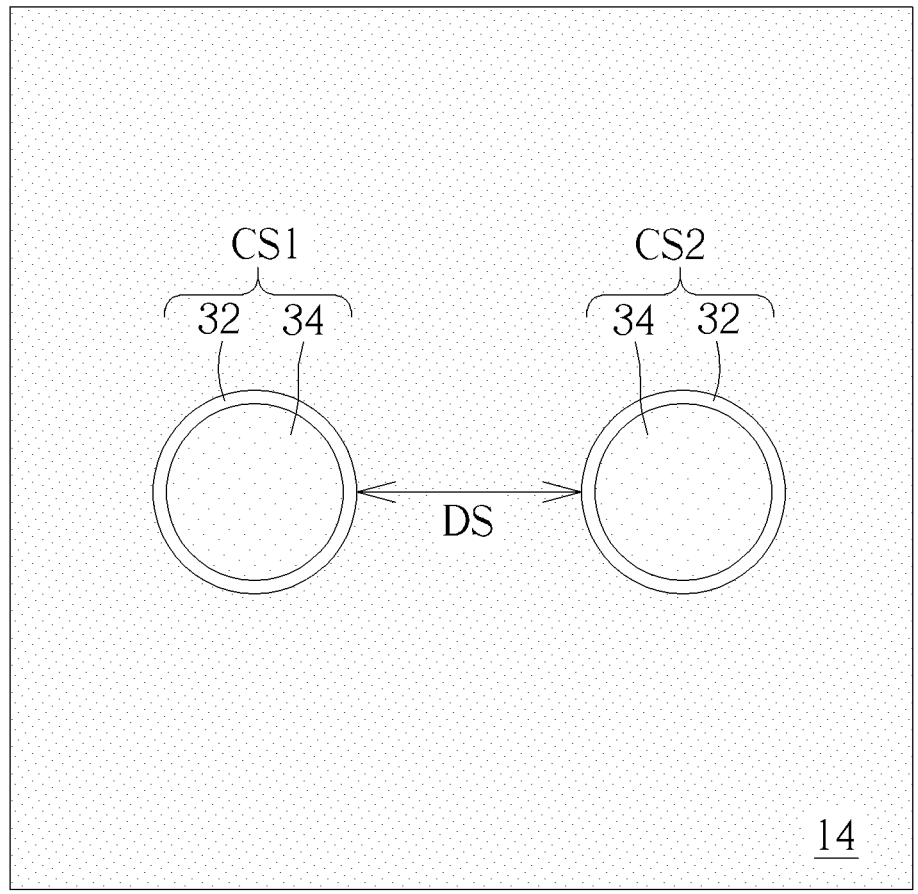
FIG. 3 is a schematic drawing illustrating a top view of an anti-fuse structure according to another embodiment of the present invention.
Figure 3:
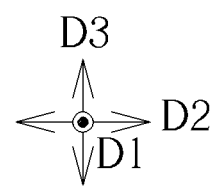

Please refer to FIGS. 1-3. FIG. 2 is a schematic drawing illustrating a top view of an anti-fuse structure according to an embodiment of the present invention, and FIG. 3 is a schematic drawing illustrating a top view of an anti-fuse structure according to another embodiment of the present invention. As shown in FIG. 1, in some embodiment, the first electrically conductive structure CS1 and the second electrically conductive structure CS2 may respectively include a barrier layer 32 and an electrically conductive material 34 disposed on the barrier layer 32. The barrier layer 32 may include titanium, titanium nitride, tantalum, tantalum nitride, or other suitable barrier materials, and the electrically conductive material 34 may include a material with relatively lower electrical resistivity, such as copper, aluminum, tungsten, and so forth, but not limited thereto. In some embodiments, the first electrically conductive structure CS1 and the second electrically conductive structure CS2 may be regarded as electrodes located at two ends of the anti-fuse structure AF, and the first electrically conductive structure CS1 and the second electrically conductive structure CS2 may respectively include a column structure, a linear structure, a wall structure, or structures with other suitable shapes.

As shown in FIG. 1 and FIG. 2, in some embodiments, the first electrically conductive structure CS1 and the second electrically conductive structure CS2 may be elongated in a direction (such as the third direction D3) orthogonal to the thickness direction of the base substrate 12 (such as the first direction D1), respectively, and may be regarded as a wall structure accordingly. Under this design, the amount of the trap rich layer 14 located between the first electrically conductive structure CS1 and the second electrically conductive structure CS2 may be increased while the distance DS between the first electrically conductive structure CS1 and the second electrically conductive structure CS2 may be unchanged for improving the operation stability of the anti-fuse structure AF, but not limited thereto. In addition, as shown in FIG. 1 and FIG. 3, in some embodiments, the first electrically conductive structure CS1 and the second electrically conductive structure CS2 may be elongated in the first direction D1, respectively, and may be regarded as a column structure accordingly. The area occupied by the anti-fuse structure AF in the first direction D1 may be reduced by this design, and the allocation density of the anti-fuse structure AF and/or the allocation density of other units may be increased accordingly, but not limited thereto. In addition, the shapes of the first electrically conductive structure CS1 and the second electrically conductive structure CS2 shown in FIG. 2 and FIG. 3 may also be applied to other embodiments of the present invention as needed.

As shown in FIG. 1, in some embodiments, the semiconductor structure 101 may further include a spacer SP1, a spacer SP2, a contact structure CT1, a contact structure CT2, a silicide layer 24, a silicide layer 26, a dielectric layer 42, and a metal line 50. The spacer SP1 and the spacer SP2 may be disposed on the sidewall of the gate structure GS for assisting in forming the lightly doped regions LDD and the source/drain doped regions SD in the manufacturing process, and the spacer SP1 and the spacer SP2 may respectively include a single layer or multiple layers of insulation materials, such as silicon oxide, silicon nitride, or other suitable insulation materials. The silicide layer 24 and the silicide layer 26 may be disposed on the source/drain doped region SD and the gate structure GS, respectively. The contact structure CT1 and the contact structure CT2 may penetrate through the dielectric layer 28 and be electrically connected with the source/drain doped region SD and the gate structure GS via the silicide layer 24 and the silicide layer 26, respectively. The silicide layer 24 and the silicide layer 26 may include cobalt-silicide, nickel-silicide, or other suitable metal silicide. In some embodiments, the contact structure CT1, the contact structure CT2, and the first electrically conductive structure CS1 and the second electrically conductive structure CS2 in the anti-fuse structure AF may be formed concurrently by the same manufacturing process and/or the same materials and have the same material composition accordingly, but not limited thereto.

The dielectric layer 42 may be disposed on the dielectric layer 28, and the dielectric layer 42 may include a single layer or multiple layers of dielectric materials, such as silicon oxide, silicon nitride, silicon oxynitride, a low-k material, or other suitable dielectric materials. The metal line 50 may be disposed in the dielectric layer 42. A portion of the metal line 50 may be electrically connected with the first electrically conductive structure CS1, and another portion of the metal line 50 may be electrically connected with the second electrically conductive structure CS2 for performing related operation of the anti-fuse structure AF. In some embodiments, the metal line 50 may be regarded as a portion of the anti-fuse structure AF, and the metal line 50 and an interconnection structure (not illustrated) located corresponding to the transistor structure TR may be concurrently formed by the same manufacturing process, but not limited thereto. In some embodiments, the metal line 50 may include a barrier layer 52 and an electrically conductive material 54 disposed on the barrier layer 52. The barrier layer 52 may include titanium, titanium nitride, tantalum, tantalum nitride, or other suitable barrier materials, and the electrically conductive material 54 may include a material with relatively lower electrical resistivity, such as copper, aluminum, tungsten, and so forth, but not limited thereto.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 4:
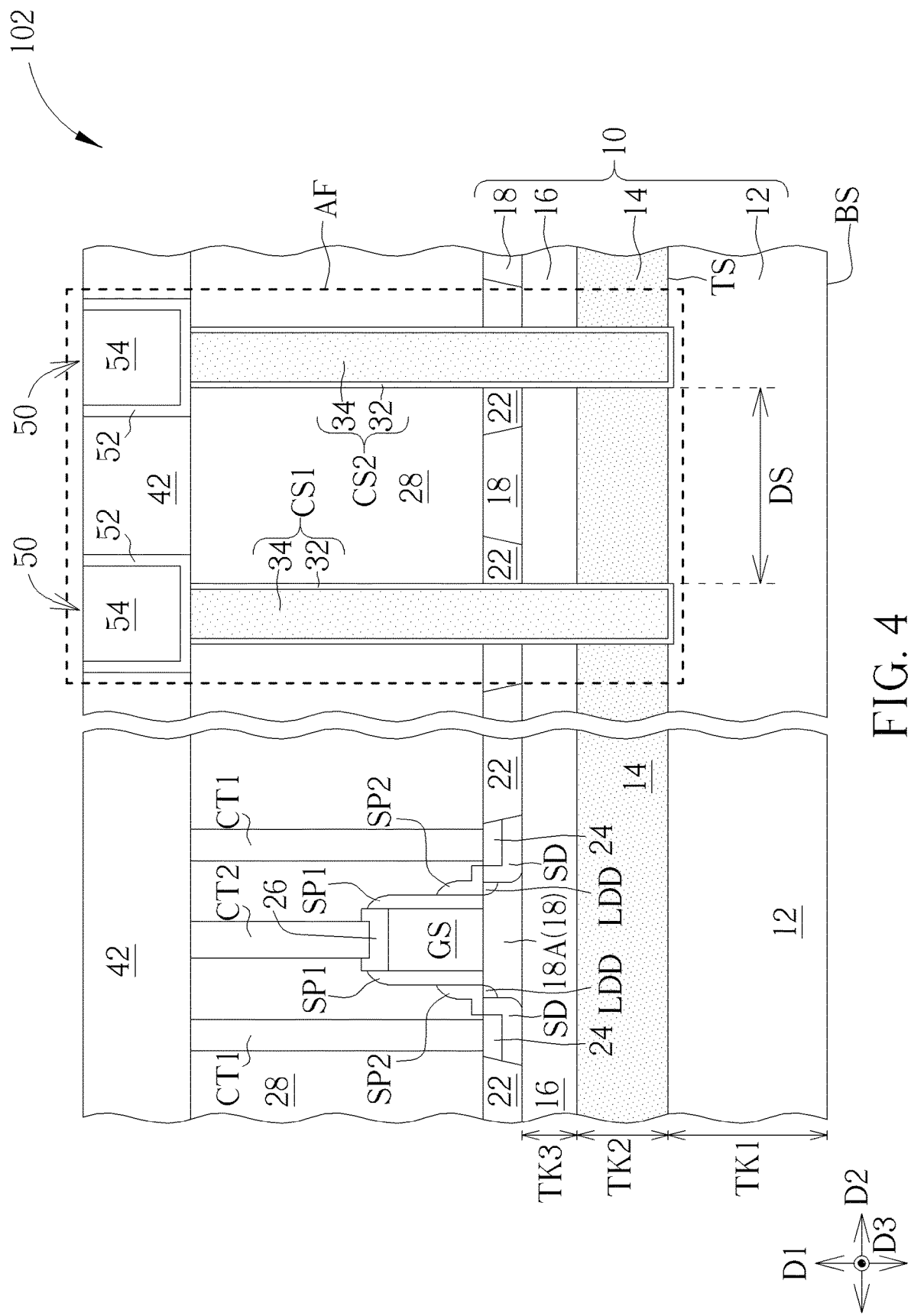
FIG. 4 is a schematic drawing illustrating a semiconductor structure according to a second embodiment of the present invention.

Please refer to FIG. 4. FIG. 4 is a schematic drawing illustrating a semiconductor structure 102 according to a second embodiment of the present invention. As shown in FIG. 4, in the semiconductor structure 102, the first electrically conductive structure CS1 and the second electrically conductive structure CS2 may penetrate through the dielectric layer 28, the isolation structure 22, the buried insulation layer 16, and the trap rich layer 14 in the first direction D1, and the first electrically conductive structure CS1 and the second electrically conductive structure CS2 may directly contact the base substrate 12, respectively. The amount of the trap rich layer 14 located between the first electrically conductive structure CS1 and the second electrically conductive structure CS2 may be increased when the first electrically conductive structure CS1 and the second electrically conductive structure CS2 penetrate through the trap rich layer 14 in the first direction D1, respectively, and the operation stability of the anti-fuse structure AF may be improved accordingly, especially when the electrical resistance of the trap rich layer 14 located between the first electrically conductive structure CS1 and the second electrically conductive structure CS2 after programming may be significantly lower than the electrical resistance of the base substrate 12 located between the first electrically conductive structure CS1 and the second electrically conductive structure CS2. In addition, when the first electrically conductive structure CS1 and the second electrically conductive structure CS2 penetrate through the trap rich layer 14 in the first direction D1, respectively, the negative influence generated by the depth control deviation of the first electrically conductive structure CS1 and/or the second electrically conductive structure CS2 in the trap rich layer 14 may be reduced accordingly, and that will be positively helpful to the characteristic control of the anti-fuse structure AF and/or the process window of the anti-fuse structure AF.

Figure 5:
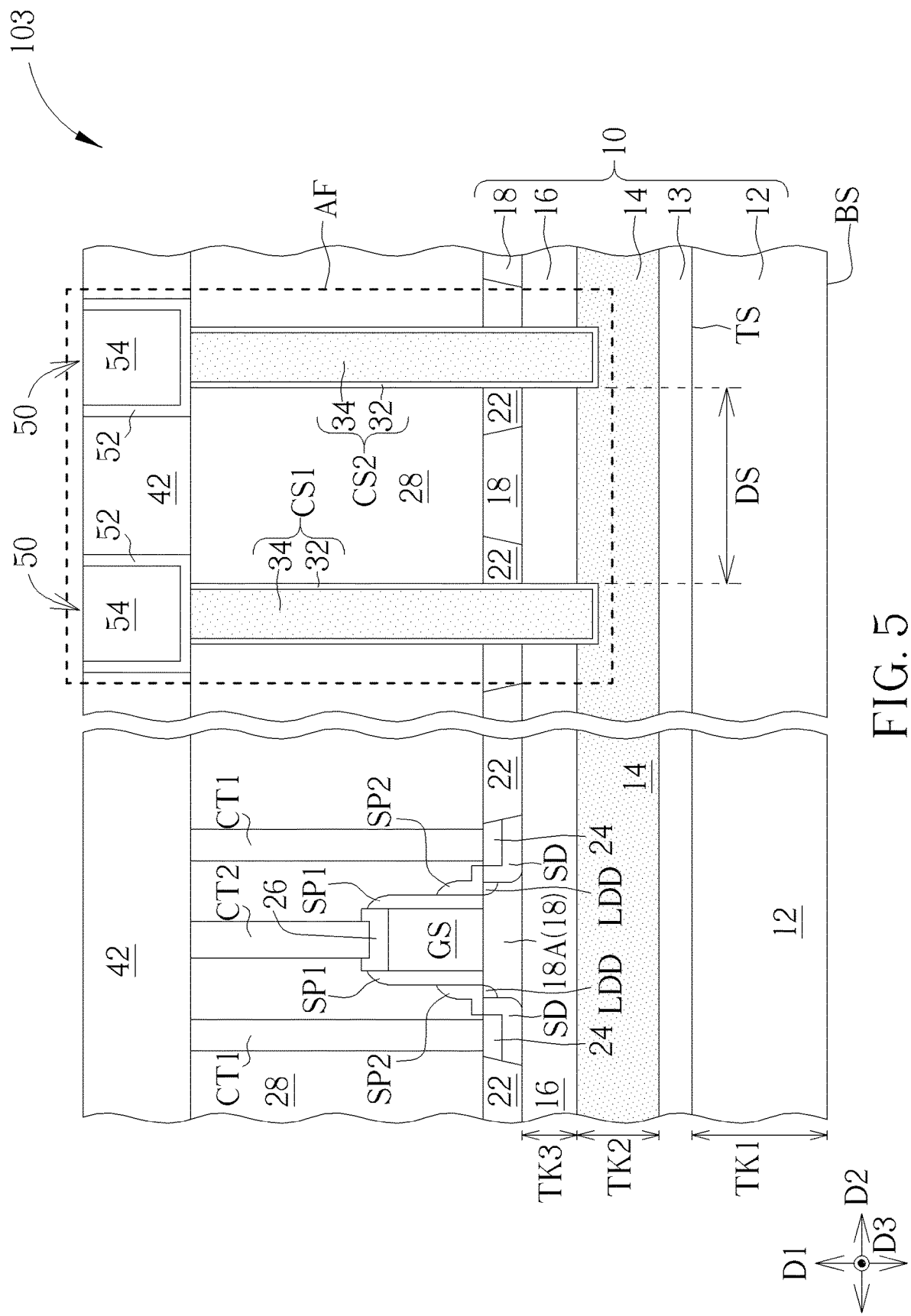
FIG. 5 is a schematic drawing illustrating a semiconductor structure according to a third embodiment of the present invention.

Please refer to FIG. 5. FIG. 5 is a schematic drawing illustrating a semiconductor structure 103 according to a third embodiment of the present invention. As shown in FIG. 5, the semiconductor structure 103 may further include an insulation layer 13 disposed between the trap rich layer 14 and the base substrate 12. The insulation layer 13 may include an oxide insulation layer or other suitable insulation materials, and a material composition of the insulation layer 13 may be different from the material composition of the trap rich layer 14. The insulation layer 13 may be used to further isolate anti-fuse structure AF from other parts (such as other active components and/or passive components formed in the base substrate 12), but not limited thereto.

To summarize the above descriptions, in the semiconductor structure according to the present invention, the first electrically conductive structure and the second electrically conductive structure may be disposed on the trap rich layer for forming the anti-fuse structure including a portion of the trap rich layer. The process of forming the anti-fuse structure may be integrated with the process of forming other semiconductor devices on the semiconductor on insulator substrate, and the purposes of process integration and/or process simplification may be achieved accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor structure, comprising:
a semiconductor on insulator (SOI) substrate comprising:

a base substrate;

a buried insulation layer disposed on the base substrate;

a semiconductor layer disposed on the buried insulation layer; and a trap rich layer disposed between the buried insulation layer and the base substrate;

a first electrically conductive structure, wherein at least a part of the first electrically conductive structure is disposed in the trap rich layer; and a second electrically conductive structure, wherein at least a part of the second electrically conductive structure is disposed in the trap rich layer, a part of the trap rich layer is disposed between the first electrically conductive structure and the second electrically conductive structure, and the first electrically conductive structure, the second electrically conductive structure, and the trap rich layer disposed between the first electrically conductive structure and the second electrically conductive structure are at least a portion of an anti-fuse structure, wherein the first electrically conductive structure and the second electrically conductive structure penetrate through the trap rich layer in a vertical direction, respectively.

2. The semiconductor structure according to claim 1, wherein the first electrically conductive structure and the second electrically conductive structure directly contact the trap rich layer, respectively.

3. The semiconductor structure according to claim 1, wherein electrical resistance of the trap rich layer is higher than or equal to $10^8$ ohms.

4. The semiconductor structure according to claim 1, wherein electrical resistivity of the trap rich layer is higher than electrical resistivity of the base substrate.

5. The semiconductor structure according to claim 1, wherein the trap rich layer comprises polysilicon, silicon oxide, silicon nitride, or silicon oxynitride.

6. The semiconductor structure according to claim 1, wherein the trap rich layer comprises an undoped polysilicon layer.

7. The semiconductor structure according to claim 1, wherein a thickness of the trap rich layer is less than a thickness of the base substrate.

8. The semiconductor structure according to claim 1, wherein the trap rich layer is directly connected with the base substrate and the buried insulation layer.

9. The semiconductor structure according to claim 1, wherein the first electrically conductive structure and the second electrically conductive structure further penetrate through the buried insulation layer in the vertical direction, respectively.

10. The semiconductor structure according to claim 1, wherein the first electrically conductive structure and the second electrically conductive structure further penetrate through the semiconductor layer in the vertical direction, respectively.

11. The semiconductor structure according to claim 1, further comprising:

an isolation structure disposed in the semiconductor layer, wherein the first electrically conductive structure and the second electrically conductive structure further penetrate through the isolation structure in the vertical direction, respectively.

12. The semiconductor structure according to claim 1, wherein the first electrically conductive structure and the second electrically conductive structure directly contact the base substrate, respectively.

13. The semiconductor structure according to claim 1, wherein a distance between the first electrically conductive structure and the second electrically conductive structure in a horizontal direction is greater than or equal to 0.2 micrometers and less than or equal to 5 micrometers.

14. The semiconductor structure according to claim 1, wherein the first electrically conductive structure and the second electrically conductive structure are elongated in a direction orthogonal to a thickness direction of the base substrate, respectively.

15. The semiconductor structure according to claim 1, wherein a part of the semiconductor layer is a body region of a transistor structure, and the semiconductor structure further comprises a dielectric layer disposed on the semiconductor on insulator substrate and covering the transistor structure.

16. The semiconductor structure according to claim 15, wherein the first electrically conductive structure and the second electrically conductive structure further penetrate through the dielectric layer in the vertical direction, respectively.

17. The semiconductor structure according to claim 15, wherein the transistor structure is a radiofrequency (RF) switch device.

18. The semiconductor structure according to claim 15, wherein the anti-fuse structure is electrically separated from the transistor structure.

* * * * *